United States Patent
Yu

(10) Patent No.: US 6,255,175 B1
(45) Date of Patent: Jul. 3, 2001

(54) FABRICATION OF A FIELD EFFECT TRANSISTOR WITH MINIMIZED PARASITIC MILLER CAPACITANCE

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/479,552

(22) Filed: Jan. 7, 2000

(51) Int. Cl.$^7$ ................................................ H01L 21/336
(52) U.S. Cl. ........................ 438/289; 438/301; 438/303; 438/305
(58) Field of Search ................................ 438/301, 303, 438/305, 302, 151, 289

(56) References Cited

U.S. PATENT DOCUMENTS

| | | | |
|---|---|---|---|
| 5,314,834 | * 5/1994 | Mazuré et al. | 437/43 |
| 5,482,871 | * 1/1996 | Pollack | 437/21 |
| 5,970,353 | * 10/1999 | Sultan | 438/302 |
| 5,977,591 | * 11/1999 | Fratin et al. | 257/344 |
| 5,998,272 | * 12/1999 | Ishida et al. | 438/305 |
| 6,008,099 | * 12/1999 | Sultan et al. | 438/305 |
| 6,093,610 | * 7/2000 | Rodder | 438/289 |
| 6,160,299 | * 12/2000 | Rodder | 257/408 |
| 6,194,748 | * 2/2001 | Yu | 438/76 |
| 6,200,869 | * 3/2001 | Yu et al. | 438/301 |

FOREIGN PATENT DOCUMENTS

411261069 * 9/1999 (JP) .......................................... 29/78

\* cited by examiner

Primary Examiner—John F. Niebling
Assistant Examiner—Walter L. Lindsay, Jr.
(74) Attorney, Agent, or Firm—Monica H. Choi

(57) ABSTRACT

A field effect transistor is fabricated to have a drain overlap and a source overlap to minimize series resistance between the gate and the drain and between the gate and the source of the field effect transistor. The parasitic Miller capacitance formed by the drain overlap and the source overlap is reduced by forming a depletion region at the sidewalls of the gate structure of the field effect transistor. The depletion region at the sidewalls of the gate structure is formed by counter-doping the sidewalls of the gate structure. The sidewalls of the gate structure at the drain side and the source side of the field effect transistor are doped with a type of dopant that is opposite to the type of dopant within the gate structure. Such dopant at the sidewalls of the gate structure forms a respective depletion region from the sidewall into approximately the edge of the drain overlap and source overlap that extends under the gate structure to reduce the parasitic Miller capacitance formed by the drain overlap and the source overlap.

12 Claims, 3 Drawing Sheets

FABRICATION OF A FIELD EFFECT TRANSISTOR WITH MINIMIZED PARASITIC MILLER CAPACITANCE

TECHNICAL FIELD

The present invention relates generally to fabrication of field effect transistors having scaled-down dimensions, and more particularly, to a method for fabricating a field effect transistor with minimized parasitic Miller capacitance between the gate and the drain and/or between the gate and the source of the field effect transistor.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow doped junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate structure 118 which may be a polysilicon gate. A gate silicide 120 is formed on the polysilicon gate 118 for providing contact to the polysilicon gate 118. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where a MOSFET is fabricated therein.

The MOSFET 100 also includes a spacer 122 disposed on the sidewalls of the polysilicon gate 118 and the gate oxide 116. When the spacer 122 is comprised of silicon nitride (SiN), then a spacer liner oxide 124 is deposited as a buffer layer between the spacer 122 and the sidewalls of the polysilicon gate 118 and the gate oxide 116.

Referring to FIG. 1, a drain overlap 130 is formed by the drain extension 104 extending under the gate structure 118, and a source overlap 132 is formed by the source extension 106 extending under the gate structure 118. The drain overlap 130 is advantageous for lowering the series resistance between the gate and the drain of the MOSFET 100, and the source overlap 132 is advantageous for lowering the series resistance between the gate and the source of the MOSFET 100.

However, the drain overlap 130 is disadvantageous because a parasitic Miller capacitance results between the gate and the drain of the MOSFET 100 from the overlap of the gate structure 118 and the gate dielectric 116 over the drain extension 104. Similarly, the source overlap 132 is disadvantageous because a parasitic Miller capacitance results between the gate and the source of the MOSFET 100 from the overlap of the gate structure 118 and the gate dielectric 116 over the source extension 106.

Although the dimensions of the MOSFET 100, such as the channel length, may further be scaled down to tens of nanometers, the drain overlap 130 and the source overlap 132 are typically not scaled down accordingly because a minimum amount of the drain overlap 130 and the source overlap 132 is desired for maintaining a relatively low series resistance between the gate and the drain and between the gate and the source of the MOSFET 100. However, as the dimensions of the MOSFET 100 are further scaled down and as the drain overlap 130 and the source overlap 132 are not scaled down accordingly, the parasitic Miller capacitance formed by the drain overlap 130 and the source overlap 132 becomes a predominant factor in degrading the device speed of the MOSFET 100.

Thus, a process is desired for fabricating a MOSFET with drain overlap and source overlap to maintain a low series resistance between the gate and the drain and between the gate and the source of the MOSFET, while at the same time minimizing the parasitic Miller capacitance formed by the drain overlap and/or the source overlap.

SUMMARY OF THE INVENTION

Accordingly, in a general aspect of the present invention, a field effect transistor is fabricated to have a drain overlap and a source overlap with reduced parasitic Miller capacitance by creating a depletion region at the sidewalls of a gate structure of the field effect transistor.

In one embodiment of the present invention, a field effect transistor with minimized parasitic Miller capacitance is fabricated within an active device area of a semiconductor substrate. A gate structure is formed on a gate dielectric on the semiconductor substrate over a portion of the active device area, and the gate structure is doped with a first type of dopant. A drain extension is formed within an exposed portion of the active device area of the semiconductor substrate on a drain side of the gate structure. The drain extension has a drain overlap that extends under the gate structure. The sidewall of the gate structure at the drain side of the gate structure is doped with a second type of dopant that is opposite to the first type of dopant. The second type of dopant forms a depletion region from the sidewall at the drain side of the gate structure into approximately an edge of the drain overlap that extends under the gate structure to reduce the parasitic Miller capacitance formed by the drain overlap.

The present invention may be used to particular advantage when the parasitic Miller capacitance between the gate and the source of the field effect transistor is also minimized. In that case, a source extension is formed within an exposed portion of the active device area of the semiconductor substrate on a source side of the gate structure. The source extension has a source overlap that extends under the gate structure. The sidewall of the gate structure at the source side of the gate structure is doped with the second type of dopant that is opposite to the first type of dopant. The second type of dopant forms a depletion region from the sidewall at the source side of the gate structure into approximately an edge of the source overlap that extends under the gate structure to reduce the parasitic Miller capacitance formed by the source overlap.

The first type of dopant is an N-type dopant, and the second type of dopant is a P-type dopant, for fabricating an NMOSFET (N-channel Metal Oxide Semiconductor Field Effect Transistor). Alternatively, the first type of dopant is a P-type dopant, and the second type of dopant is an N-type dopant, for fabricating a PMOSFET (P-channel Metal Oxide Semiconductor Field Effect Transistor).

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, and 8 refer to elements having similar structure and function.

DETAILED DESCRIPTION

Figure 1:
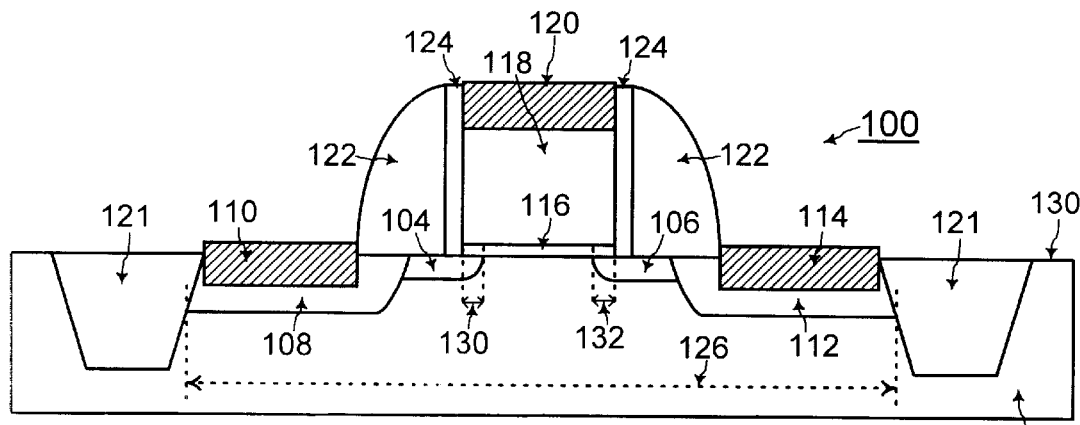
FIG. 1 shows a cross-sectional view of a MOSFET (Metal Oxide Semiconductor Field Effect Transistor) having drain and source extensions for scaled down dimensions of the MOSFET.
Figure 2:
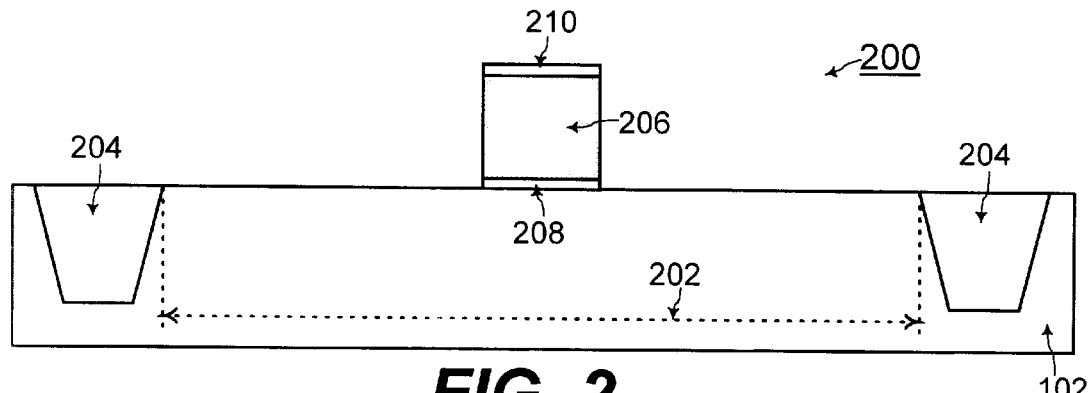
FIGS. 2, 3, 4, 5, 6, 7, and 8 show cross-sectional views of a MOSFET fabricated according to the present invention for illustrating the steps for minimizing parasitic Miller capacitance between the gate and the drain and between the gate and the source of the MOSFET by creating a respective depletion region at the sidewalls of the gate structure of the MOSFET.

Referring to FIG. 2, in a general aspect of the present invention, a MOSFET (Metal Oxide Semiconductor Field Effect Transistor) 200 of the present invention is fabricated to have drain overlap and source overlap to maintain a low series resistance between the gate and the drain and between the gate and the source of the MOSFET 200. In addition, the MOSFET 200 is fabricated to have minimized parasitic Miller capacitance formed by the drain overlap and the source overlap.

Referring to FIG. 2, such a MOSFET 200 is fabricated within an active device area 202 which may be defined between trench isolation structures 204 in the semiconductor substrate 102. A gate structure 206 is formed on a gate dielectric 208 on the semiconductor substrate 102 over a portion of the active device area 202. When the semiconductor substrate 102 is a silicon substrate, the gate structure 206 may be comprised of polysilicon and the gate dielectric may be comprised of silicon dioxide ($SiO_2$).

A capping layer 210 may be formed on the top of the gate structure 206. The capping layer 210 may be silicon oxynitride (SiON) that was formed during the patterning and etching process for the gate structure 206, as known to one of ordinary skill in the art of integrated circuit fabrication. The capping layer 210 disposed on top of the gate structure 206 prevents implantation of dopant into top of the gate structure 206. Fabrication processes for formation of the gate structure 206, the gate dielectric 208, and the capping layer 210 are known to one of ordinary skill in the art of integrated circuit fabrication.

Figure 3:
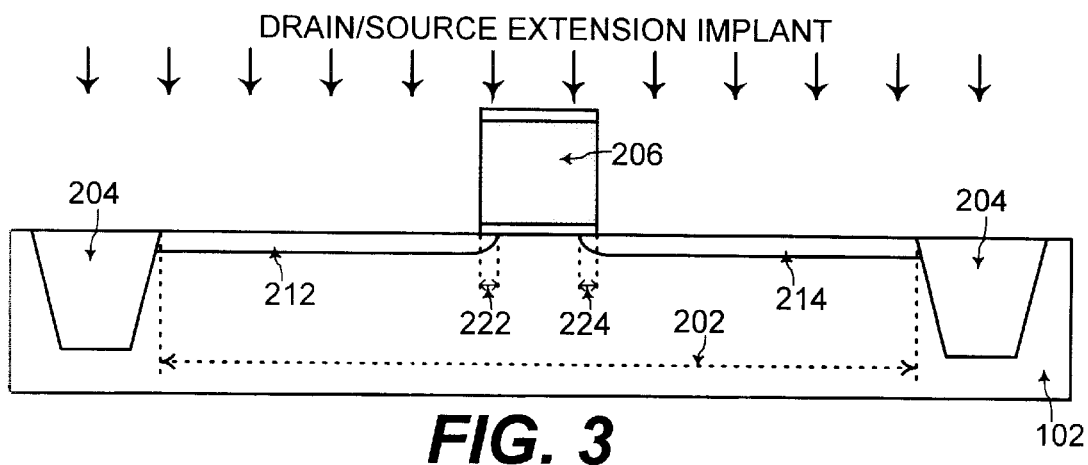

Referring to FIG. 3, after formation of the gate structure 206, a drain and source extension implant is performed for forming a drain extension 212 and a source extension 214. The dopant used for this drain and source extension implant is an N-type dopant for fabricating an NMOSFET (N-channel Metal Oxide Semiconductor Field Effect Transistor) and is a P-type dopant for fabricating a PMOSFET (P-channel Metal Oxide Semiconductor Field Effect Transistor). The dopant within the drain extension 212 and the source extension 214 is then activated typically using a RTA (Rapid Thermal Anneal) process. The drain extension 212 and the source extension 214 are shallow junctions for minimizing short-channel effects in the MOSFET 200. Such implantation and activation processes for forming the drain extension 212 and the source extension 214 are known to one of ordinary skill in the art of integrated circuit fabrication.

Further referring to FIG. 3, for minimizing series resistance between the gate and the drain of the MOSFET 200, the drain extension 212 includes a drain overlap 222 that extends under the gate dielectric 208 and the gate structure 206. Similarly, for minimizing series resistance between the gate and the source of the MOSFET 200, the source extension 214 includes a source overlap 224 that extends under the gate dielectric 208 and the gate structure 206. Such drain overlap 222 results in parasitic Miller capacitance between the gate and the drain of the MOSFET 200, as known to one of ordinary skill in the art of integrated circuits. Similarly, the source overlap 224 results in parasitic Miller capacitance between the gate and the source of the MOSFET 200, as known to one of ordinary skill in the art of integrated circuits.

Figure 4:
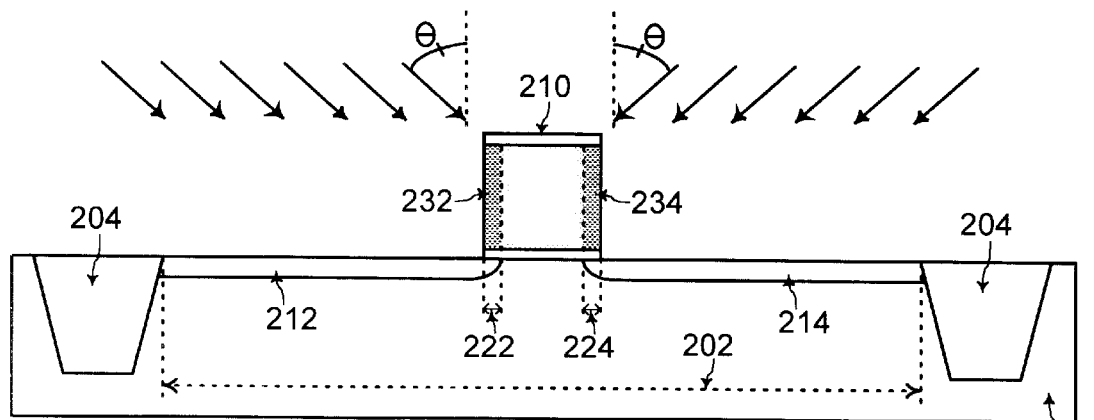

Referring to FIG. 4, to minimize such parasitic Miller capacitance, a depletion region is formed on the sidewalls of the gate structure 206 toward the drain side and the source side of the MOSFET 200. A first depletion region 232 is formed on the sidewall of the gate structure 206 toward the drain side of the gate structure 206 for reducing the parasitic Miller capacitance formed by the drain overlap 222. Similarly, a second depletion region 234 is formed on the sidewall of the gate structure 206 toward the source side of the gate structure 206 for reducing the parasitic Miller capacitance formed by the source overlap 224.

Further referring to FIG. 4, the first and second depletion regions 232 and 234 are formed by counter-doping the sidewalls of the gate structure 206. In such a counter-doping process, the gate structure 206 is doped with a first type of dopant, and the sidewalls of the gate structure 206 are doped with a second type of dopant that is opposite to the first type of dopant for creating the depletion regions 232 and 234. For example, the first type of dopant is an N-type dopant, and the second type of dopant is a P-type dopant for fabricating an NMOSFET (N-channel Metal Oxide Semiconductor Field Effect Transistor). Alternatively, the first type of dopant is a P-type dopant, and the second type of dopant is an N-type dopant for fabricating a PMOSFET (P-channel Metal Oxide Semiconductor Field Effect Transistor).

Referring to FIG. 4, the first depletion region 232 formed at the sidewall of the gate structure 206 toward the drain side of the gate structure 206 extends from such a sidewall to the edge of the drain overlap 222 (as shown by the dashed line in FIG. 4) to effectively reduce the Miller capacitance formed by the drain overlap 222. The first depletion region 232 is a dielectric material of a relatively large thickness (i.e., the height of the gate structure 206) that introduces a low capacitance in series with the parasitic Miller capacitance formed by the drain overlap 222. Such a capacitance formed by the first depletion region 232 lowers the effective capacitance between the gate and the drain of the MOSFET 200.

Similarly, the second depletion region 234 formed at the sidewall of the gate structure 206 toward the source side of the gate structure 206 extends from such a sidewall to the edge of the source overlap 224 (as shown by the dashed line in FIG. 4) to effectively reduce the Miller capacitance formed by the source overlap 222. The second depletion region 234 is a dielectric material of a relatively large thickness (i.e., the height of the gate structure 206) that introduces a low capacitance in series with the parasitic Miller capacitance formed by the source overlap 224. Such a capacitance formed by the second depletion region 234 lowers the effective capacitance between the gate and the source of the MOSFET 200.

For effectively forming the first depletion region 232 and the second depletion region 234, the second type of dopant is implanted into the sidewalls of the MOSFET 200 using a large angle tilt implantation. For implantation of the second type of dopant into the sidewall of the gate structure 206 toward the drain side of the gate structure 206, the second type of dopant is implanted toward the gate structure 206 from the drain side at an angle θ in a range of approximately 30° to 60° with respect to an axis that is perpendicular to the surface of the semiconductor substrate 102. Similarly, for implantation of the second type of dopant into the sidewall of the gate structure 206 toward the source side of the gate structure 206, the second type of dopant is implanted toward the gate structure 206 from the source side at an angle θ in a range of approximately 30° to 60° with respect to an axis that is perpendicular to the surface of the semiconductor substrate 102.

Such implantation at a large angle tilt is effective for doping the sidewalls of the gate structure 206. The implantation energy and the dose of the second type of dopant is controlled in the large angle tilt implantation process such that the first depletion region 232 extends from the sidewall of the gate structure 206 toward the drain side of the gate structure 206 to the edge of the drain overlap 222 and such that the second depletion region 234 extends from the sidewall of the gate structure 206 toward the source side of the gate structure 206 to the edge of the source overlap 224. Large angle tilt implantation processes are known to one of ordinary skill in the art of integrated circuit fabrication.

Further referring to FIG. 4, the capping layer 210 on top of the gate structure 206 blocks implantation of the second type of dopant into the top of the gate structure 206. With such blockage of the second type of dopant from the top of the gate structure 206, the first depletion region 222 and the second depletion region 224 are confined to be at the sidewalls of the gate structure 206 to minimize adverse effects from the second dopant within other parts of the gate structure 206.

Figure 5:
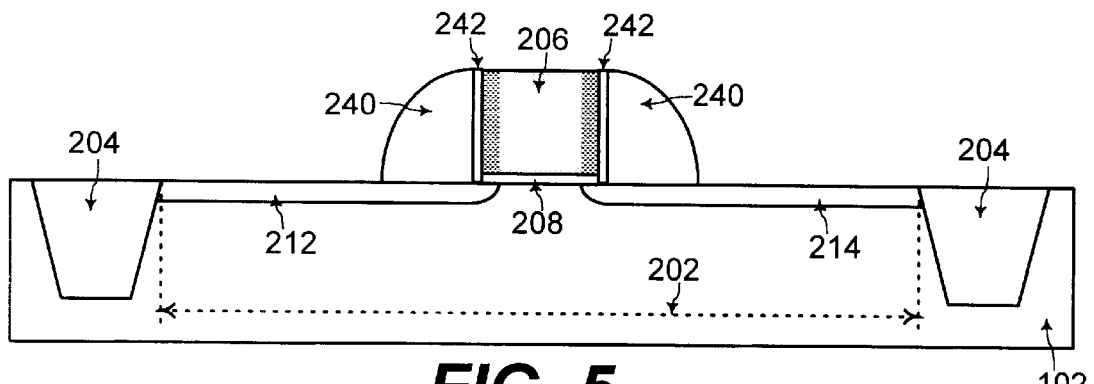

Referring to FIG. 5, the capping layer 210 is removed from the top of the gate structure 206 after the large angle tilt implantation of the second type of dopant into the sidewalls of the gate structure 206. A spacer 240 is formed on the sidewalls of the gate structure 206. When the spacer 240 is comprised of silicon nitride (SiN), then a spacer liner oxide 242 is deposited as a buffer layer between the spacer 240 and the sidewalls of the gate structure 206. Fabrication processes for formation of the spacer 240 and the spacer liner oxide 242 are known to one of ordinary skill in the art of integrated circuit fabrication.

Figure 6:
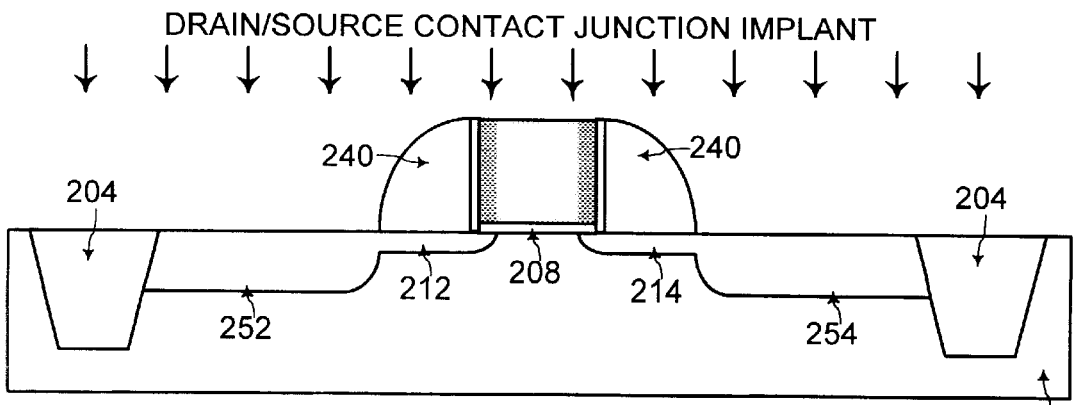

Referring to FIG. 6, a drain contact junction 252 and a source contact junction 254 are formed by an implantation of dopant into the exposed portions of the active device area 202 of the semiconductor substrate 102. The drain contact junction 252 and the source contact junction 254 are deeper junctions such that a relatively large silicide may be fabricated therein to provide low resistance contact to the drain and the source respectively of the MOSFET 200. The dopant within the drain contact junction 252 and the source contact junction 254 is then activated by typically using a RTA (Rapid Thermal Anneal) process. Processes for such implantation and activation of dopant for formation of the drain contact junction 252 and the source contact junction 254 are known to one of ordinary skill in the art of integrated circuit fabrication.

Figure 7:
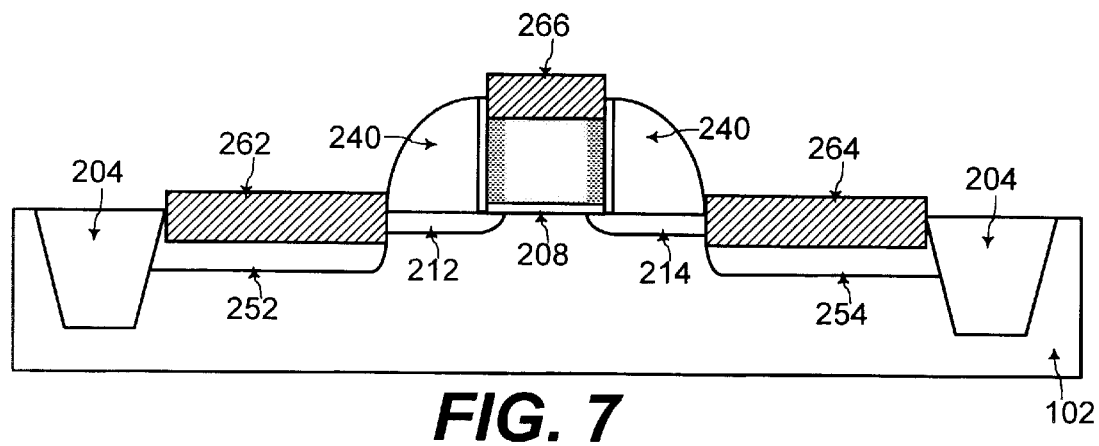

Referring to FIG. 7, a drain silicide 262 is formed with the drain contact junction 252 for providing contact to the drain of the MOSFET 200, and a source silicide 264 is formed with the source contact junction 254 for providing contact to the source of the MOSFET 200. A gate silicide 266 is formed with the gate structure 206 for providing contact to the gate of the MOSFET 200. Such silicides may be comprised of one of cobalt silicide ($CoSi_2$) or titanium silicide ($TiSi_2$) for example, and processes for formation of such suicides are known to one of ordinary skill in the art of integrated circuit fabrication.

Figure 8:
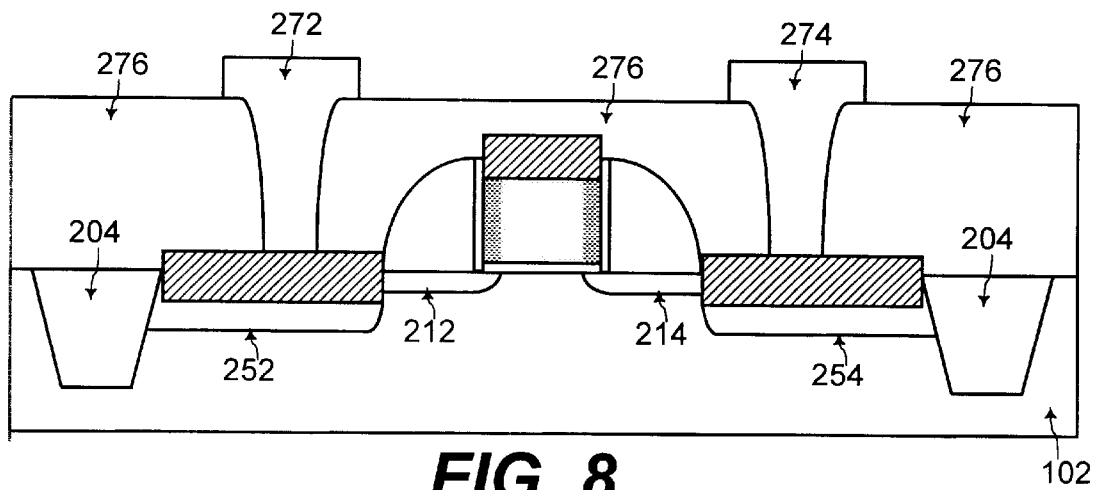

Referring to FIG. 8, conventional fabrication processes may follow for forming contacts and interconnects to the MOSFET 200 such as a drain contact 272 to provide connection to the drain silicide 262 and a source contact 274 to provide connection to the source silicide 264. Field oxides 276 may also be deposited for electrical isolation of the components of the MOSFET 200.

In this manner, by introducing a depletion region at the sidewalls toward the drain side and the source side of the gate structure 206, the effect of the parasitic Miller capacitance formed by the drain overlap 222 and the source overlap 224 is minimized. Thus, the effective parasitic capacitance between the gate and the drain and between the gate and the source of the MOSFET 200 is reduced. The drain overlap 222 and the source overlap 224 may then be formed to lower the series resistance between the gate and the drain and between the gate and the source without significantly degrading the speed performance of MOSFET 200 with scaled down dimensions.

The foregoing is by way of example only and is not intended to be limiting. For example, any specified material of any structure described herein is by way of example only. In addition, a depletion region may be formed at the sidewall of the gate structure 206 at the drain side and/or the source side of the MOSFET 200 for lowering the parasitic Miller capacitance. Generally, the parasitic Miller capacitance between the gate and the drain of the MOSFET is more critical in determining the speed performance of an integrated circuit. In that case, only the first depletion region 232 may be formed at the sidewall toward the drain side of the gate structure 206 without the second depletion region 234. However, in other integrated circuits, the parasitic Miller capacitance both between the gate and drain and between the gate and source of the MOSFET may determine the speed performance of the integrated circuit. In that case, both the first depletion region 232 and the second depletion region 234 at the sidewalls toward both the drain side and the source side of the gate structure 206 may be formed.

Furthermore, as will be understood by those skilled in the art, the structures described herein may be made or used in the same way regardless of their position and orientation. Accordingly, it is to be understood that terms and phrases such as "top," "sidewall," "over," and "under" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor, with minimized parasitic Miller capacitance, within an active device area of a semiconductor substrate, the method including the steps of:

A. forming a gate structure on a gate dielectric on said semiconductor substrate over a portion of said active device area, said gate structure being doped with a first type of dopant;

B. forming a drain extension within an exposed portion of said active device area of said semiconductor substrate on a drain side of said gate structure, said drain extension having a drain overlap that extends under said gate structure; and C. doping a sidewall of said gate structure at said drain side of said gate structure with a second type of dopant that is opposite to said first type of dopant, said second type of dopant forming a depletion region from said sidewall at said drain side of said gate structure into approximately an edge of said drain overlap that extends under said gate structure to reduce a parasitic Miller capacitance formed by said drain overlap.

2. The method of claim 1, further including the steps of:

D. forming a source extension within an exposed portion of said active device area of said semiconductor substrate on a source side of said gate structure, said source extension having a source overlap that extends under said gate structure; and E. doping a sidewall of said gate structure at said source side of said gate structure with said second type of dopant that is opposite to said first type of dopant, said second type of dopant forming a depletion region from said sidewall at said source side of said gate structure into approximately an edge of said source overlap that extends under said gate structure to reduce a parasitic Miller capacitance formed by said source overlap.

3. The method of claim 2, wherein said step E includes the step of:

implanting said second type of dopant into said sidewall of said gate structure at said source side of said gate structure at an angle directed toward said gate structure.

4. The method of claim 3, wherein said angle of implanting said second type of dopant into said sidewall at said source side of said gate structure is in a range of approximately 30° to 60° with respect to an axis that is perpendicular to the surface of said semiconductor substrate.

5. The method of claim 1, wherein said step C includes the step of:

implanting said second type of dopant into said sidewall of said gate structure at said drain side of said gate structure at an angle directed toward said gate structure.

6. The method of claim 5, wherein said angle of implanting said second type of dopant into said sidewall at said drain side of said gate structure is in a range of approximately 30° to 60° with respect to an axis that is perpendicular to the surface of said semiconductor substrate.

7. The method of claim 5, further including the step of:

forming a capping layer on top of said gate structure to block implantation of said second type of dopant into said top of said gate structure, before said step C.

8. The method of claim 7, wherein said gate structure is comprised of polysilicon, and wherein said capping layer is comprised of silicon oxynitride (SiON).

9. The method of claim 7, further including the step of:

removing said capping layer, after said step C;

forming a spacer on sidewalls of said gate structure; and forming a drain contact junction and a source contact junction of said field effect transistor.

10. The method of claim 1, wherein said first type of dopant is an N-type dopant and wherein said second type of dopant is a P-type dopant for fabricating an NMOSFET (N-channel Metal Oxide Semiconductor Field Effect Transistor).

11. The method of claim 1, wherein said first type of dopant is a P-type dopant and wherein said second type of dopant is an N-type dopant for fabricating a PMOSFET (P-channel Metal Oxide Semiconductor Field Effect Transistor).

12. A method for fabricating a MOSFET (Metal Oxide Semiconductor Field Effect Transistor), with minimized parasitic Miller capacitance, within an active device area of a semiconductor substrate, the method including the steps of:

A. forming a gate structure comprised of polysilicon on a gate dielectric on said semiconductor substrate over a portion of said active device area, said gate structure being doped with a first type of dopant;

B. forming a capping layer on top of said gate structure, said capping layer being comprised of silicon oxynitride (SiON);

C. forming a drain extension within an exposed portion of said active device area of said semiconductor substrate on a drain side of said gate structure, said drain extension having a drain overlap that extends under said gate structure;

D. forming a source extension within an exposed portion of said active device area of said semiconductor substrate on a source side of said gate structure, said source extension having a source overlap that extends under said gate structure;

E. doping a sidewall of said gate structure at said drain side of said gate structure with a second type of dopant that is opposite to said first type of dopant, said second type of dopant forming a depletion region from said sidewall at said drain side of said gate structure into approximately an edge of said drain overlap that extends under said gate structure to reduce a parasitic Miller capacitance formed by said drain overlap that extends under said gate structure;

F. doping a sidewall of said gate structure at said source side of said gate structure with said second type of dopant, said second type of dopant forming a depletion region from said sidewall at said source side of said gate structure into approximately an edge of said source overlap that extends under said gate structure to reduce a parasitic Miller capacitance formed by said source overlap;

and wherein said first type of dopant is an N-type dopant and wherein said second type of dopant is a P-type dopant for fabricating an NMOSFET (N-channel Metal Oxide Semiconductor Field Effect Transistor);

and wherein said first type of dopant is a P-type dopant and wherein said second type of dopant is an N-type dopant for fabricating a PMOSFET (P-channel Metal Oxide Semiconductor Field Effect Transistor);

and wherein said second type of dopant is implanted into said sidewalls at said drain side and said source side of said gate structure at an angle of implantation that is in a range of approximately 30° to 60° with respect to an axis that is perpendicular to the surface of said semiconductor substrate;

and wherein said capping layer disposed on top of said gate structure blocks implantation of said second type of dopant into top of said gate structure;

G. removing said capping layer from top of said gate structure;

H. forming a spacer on sidewalls of said gate structure; and

I. forming a drain contact junction and a source contact junction of said MOSFET.

* * * * *